United States Patent [19]

von Rauch et al.

[11] 4,101,778

[45] Jul. 18, 1978

[54] ROD-SHAPED SPECIMEN HOLDER FOR AN OPTICAL CORPUSCULAR-BEAM APPARATUS

[75] Inventors: Moriz von Rauch, Berlin, Fed. Rep. of Germany; Lee H. Veneklasen, San Leandro, Calif.

[73] Assignee: Siemens Aktiengesellschaft, Munich, Fed. Rep. of Germany

[21] Appl. No.: 722,562

[22] Filed: Sep. 13, 1976

[30] Foreign Application Priority Data

Sep. 19, 1975 [DE] Fed. Rep. of Germany ....... 2542351

[51] Int. Cl.² ............................................. G21K 5/06
[52] U.S. Cl. ..................................... 250/441; 250/442
[58] Field of Search ........................ 250/441, 442, 457

[56] References Cited

U.S. PATENT DOCUMENTS

| | | | |
|---|---|---|---|
| 2,220,973 | 11/1940 | Marton | 250/441 |
| 3,858,049 | 12/1971 | Koch et al. | 250/441 |

FOREIGN PATENT DOCUMENTS 966,493  8/1957  Fed. Rep. of Germany.

*Primary Examiner*—Bruce C. Anderson
*Attorney, Agent, or Firm*—Kenyon & Kenyon, Reilly, Carr & Chapin

[57] ABSTRACT

An optical corpuscular-beam apparatus including a rod-shaped specimen holder passing through a wall of the apparatus, which holder is secured in the apparatus wall by a first bearing and engages an adjustable counterbearing in the interior of the apparatus. The improvement of the invention comprises the first bearing comrising a diaphragm disposed circumferentially about the specimen holder and having an outer edge mechanically coupled to the apparatus wall.

2 Claims, 1 Drawing Figure

U.S. Patent   July 18, 1978   4,101,778
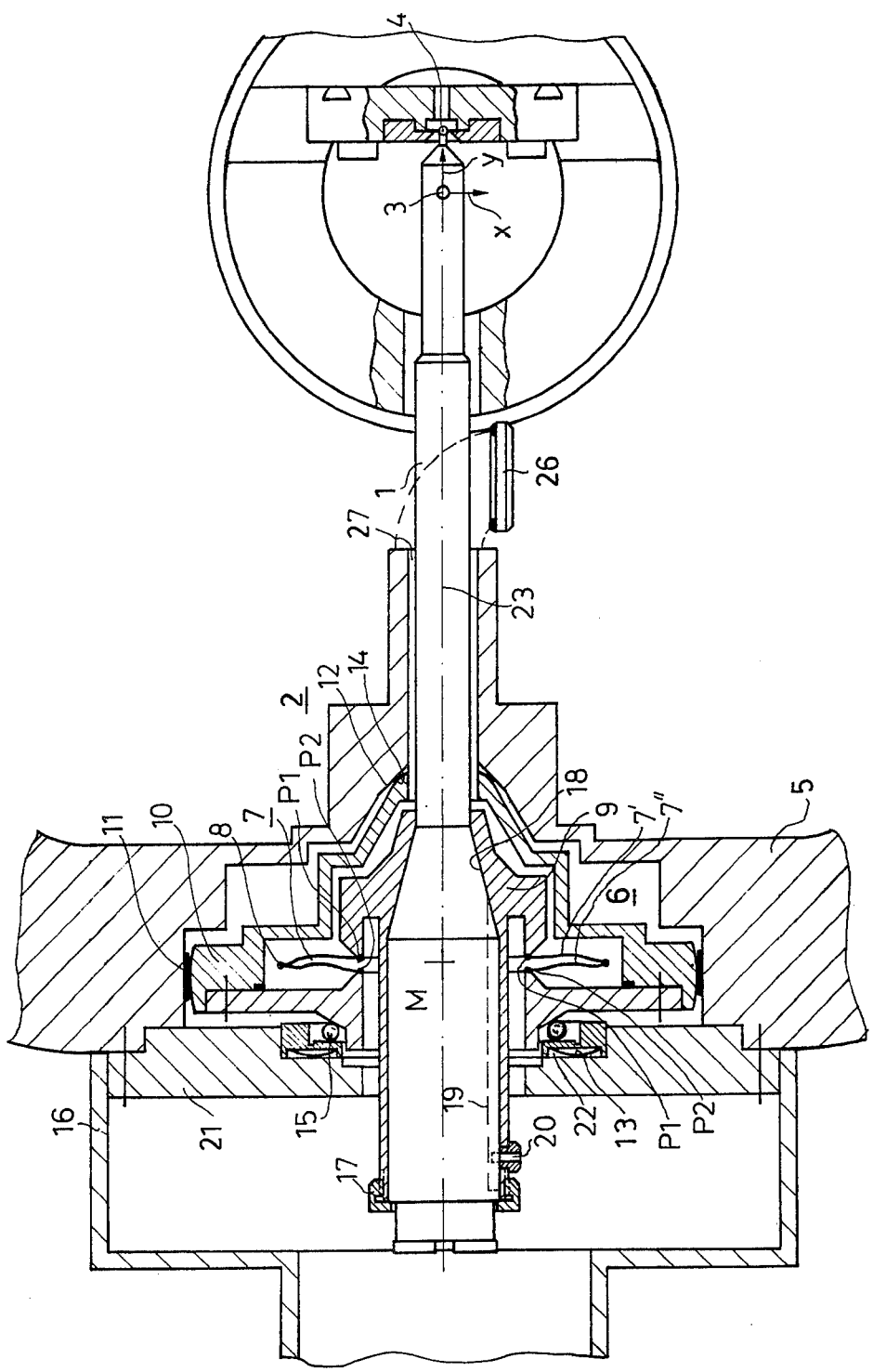

ROD-SHAPED SPECIMEN HOLDER FOR AN OPTICAL CORPUSCULAR-BEAM APPARATUS

BACKGROUND OF THE INVENTION

1. Field of the Invention

This invention relates to an optical corpuscular-beam apparatus, e.g., an electron microscope, having a rod-shaped specimen holder which is secured in the apparatus wall by a first bearing and engages an adjustable counterbearing in the interior of the apparatus.

2. Description of the Prior Art

Optical corpuscular-beam apparatus having a rod-shaped specimen holder are known in the art. See, for example, French Pat. No. 2,102,553. Such specimen holders are movable in two perpendicular directions which directions lie in a plane perpendicular to the corpuscular beam path. Movement of the adjustable counterbearing in one of the two perpendicular directions results in the specimen holder following the motion of the counterbearing.

In the known apparatus, the first bearing, which secures the specimen holder in the apparatus wall, is a sleeve held motionless with respect to the apparatus wall which sleeve surrounds the specimen holder at its outer end with a sliding fit. As the specimen holder is moved in one of the two perpendicular directions, the specimen holder also moves relative to the sleeve. The sleeve, however, resists the movement of the specimen holder, and friction between the sleeve and the specimen holder may restrain the specimen holder so that it cannot immediately or completely follow the motion of the counterbearing.

SUMMARY OF THE INVENTION

It is therefore an object of the present invention to provide an improved rod-shaped specimen holder for an optical corpuscular-beam apparatus which overcomes the aforementioned problems of moving the specimen holder while assuring that the specimen holder is secured in the apparatus wall.

These and other objects of the invention are achieved in an optical corpuscular-beam apparatus including a rod-shaped specimen holder passing through a wall of the apparatus. The holder is secured in the apparatus wall by a first bearing and engages an adjustable counterbearing in the interior of the apparatus. The improvement of the invention comprises the first bearing comprising a diaphragm disposed circumferentially about the specimen holder and having an outer edge mechanically coupled to the apparatus wall.

A diaphragm as the first bearing provides the required transversal stiffness and only little longitudinal stiffness. Transversal stiffness means resistance of the diaphragm bearing to movement of the specimen holder transversely to its axis whereas longitudinal stiffness means resistance to movement along its axis. A diaphragm also has a high torsional stiffness, i.e., a high resistance to torsion of the specimen holder, which results in a firm correlation between the plane of the object and the corpuscular beam.

In another embodiment of the invention, the diaphragm is secured in a housing which is rotatable with respect to the apparatus wall. The large torsional stiffness of the diaphragm results in a rotation of the specimen holder, and thereby of the specimen, upon a rotation of the housing. The specimen is thereby rotated with respect to the corpuscular beam and thus irradiated by the beam at different angles.

In order to reduce the longitudinal stiffness of the diaphragm bearing according to the invention, the diaphragm can be comprised of two diaphragm surfaces mechanically coupled to each other at their outer edges. The longitudinal stiffness of a diaphragm comprised of two diaphragm surfaces is reduced by a factor of 2 since longitudinal stiffness is inversely proportional to the number of diaphragm surfaces.

These and other features of the invention will be described in greater detail in the following detailed description.

BRIEF DESCRIPTION OF THE DRAWING

The drawing is a schematic illustration of an improved rod-shaped specimen holder for an optical corpuscular-beam apparatus constructed according to the invention.

DETAILED DESCRIPTION

Referring now to the drawing, there is shown, in schematic form, an electron microscope 2 having a rod-shaped specimen holder 1. Specimen holder 1 engages with its point an adjustable counterbearing 4 and is held in a wall 5 of microscope 2 by a diaphragm bearing 6. Counterbearing 4 is adjustable in three directions $x$, $y$, and $z$ by devices not shown. The $z$-direction, not shown, is perpendicular to the plane of the drawing and represents the direction of the electron beam.

Diaphragm bearing 6 includes a diaphragm 7, which comprises two diaphragm surfaces 7' and 7" which are welded together at their outer edge 8. Diaphragm surface 7' is fastened at the points designated P1 to a setting member 9 for the specimen holder 1. Diaphragm surface 7" is secured in a rotatable housing 10. P2 marks the points where the diaphragm surface 7" is mechanically rigidly coupled, as for instance, by a weld, to housing 10.

Specimen holder 1 is secured by a pressure ring 17 in a conical seat 18 of setting member 9 and is pressed into counterbearing 4 under the force of an elastic pre-tension impressed on diaphragm 7. A pin 20, which is engaged into a longitudinally milled slot 19 of specimen holder 1, prevents rotation of the specimen holder 1 in setting member 9. Housing 10 is pressed by a cup spring 13 into a conical seat 14 in wall 5 of the microscope 2. Cup spring 13 is braced against the inner surface 22 of a cover 21 which is coupled to microscope wall 5 and engages the outer surface of housing 10 by means of a rotating bearing 15.

An adjustment of counterbearing 4 in one of the directions $x$, $y$, or $z$ results in a movement of specimen holder 1 with respect to housing 10. A movement of counterbearing 4 in the $x$- or $z$-direction results in a tilting of the specimen holder with respect to housing 10 about a fulcrum which is near the center M of the diaphragm surfaces 7' and 7". A movement of counterbearing 4 in the $y$-direction moves specimen holder 1 with respect to housing 10 in the direction of specimen holder axis. Diaphragm bearing 6 presents insignificant resistance to the tilting and axial movement of specimen holder 1. Diaphragm 7 of diaphragm bearing 6, due to the pre-tension impressed on it, causes specimen holder 1 to follow the movement of counterbearing 4 without delay.

Specimen holder 1 can also be tilted with respect to microscope wall 5 by a rotation of housing 10. Housing 10 is rotatable by means of rotating bearings 11, 12 and 15 in microscope wall 5. The rotation of the housing 10 is transmitted by diaphragm surfaces 7' and 7" to specimen holder 2. Because of the high torsional stiffness of the diaphragm surfaces, the specimen holder immediately follows the rotation of housing 10.

Specimen holder 1 ends in an outer housing 16, the interior of which is under the same vacuum during operation of the microscope as the rest of the interior of the microscope. To take specimen holder 1 out of microscope 2, pressure ring 17 is first removed by a gripper, not shown, in the interior of outer housing 16 and the specimen holder is retracted from the interior of the microscope far enough so that an air lock gate 26, schematically illustrated in the drawing, is able to operate. Gate 26 covers an opening 27 in the microscope wall 5 and thereby seals the interior of the microscope vacuum-tight from the outer housing 16. Subsequently, outer housing 16 is vented and the specimen holder taken out.

Instead of the two diaphragm surfaces shown in the figure, diaphragm bearing 6 may also have, for instance, only a single diaphragm surface. In that case, the diaphragm is mechanically coupled to setting member 9 at the places corrsponding to points P1 and to housing 10 at the outer edge of the diaphragm surface.

The present invention has been described with specific reference to an electron microscope. It should be noted, however, that the invention is also applicable to optical corpuscular-beam apparatus of other kinds, for example, ion microscopes and electron beam or ion-beam machining equipment.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In an optical corpuscular-beam apparatus including a rod-shaped specimen holder passing through a wall of the apparatus, said holder being secured in the apparatus wall by a first bearing and engaging at one end an adjustable counterbearing in the interior of the apparatus, which apparatus interior is under a vacuum during operation of the apparatus; the improvement comprising:

an outer housing, mounted on said apparatus wall and disposed about the other end of said specimen holder, which other end is located outside said apparatus interior, the interior of said outer housing being under vacuum during the operation of the apparatus; and said first bearing comprising a diaphragm disposed circumferentially about said rod-shaped specimen holder, said diaphragm being mounted in a second housing mounted within and rotatable with respect to said apparatus wall.

2. The optical corpuscular-beam apparatus recited in claim 1, wherein said diaphragm is comprised of two diaphragm surfaces mechanically coupled to each other at their outer edges.

* * * * *